United States Patent
Krishnamurthy

(10) Patent No.: US 6,271,713 B1
(45) Date of Patent: *Aug. 7, 2001

(54) DYNAMIC THRESHOLD SOURCE FOLLOWER VOLTAGE DRIVER CIRCUIT

(75) Inventor: Ram K. Krishnamurthy, Beaverton, OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/311,917

(22) Filed: May 14, 1999

(51) Int. Cl.[7] ........................................ H03K 3/01
(52) U.S. Cl. .......................... 327/534; 327/170; 327/112
(58) Field of Search ................... 327/170, 376, 327/381, 391, 534, 535, 537, 112; 326/87

(56) References Cited

U.S. PATENT DOCUMENTS

| | | | |
|---|---|---|---|
| 4,616,148 | 10/1986 | Ochii et al. | 327/55 |
| 4,885,479 | 12/1989 | Oritani | 326/25 |
| 5,034,623 | 7/1991 | McAdams | 327/74 |
| 5,086,427 | 2/1992 | Wittaker et al. | 370/85.1 |
| 5,434,526 * | 7/1995 | Tanigashira et al. | 327/389 |
| 5,461,338 | 10/1995 | Hirayama et al. | 327/534 |
| 5,483,181 | 1/1996 | D'Souza | 326/98 |
| 5,559,368 | 9/1996 | Hu et al. | 257/369 |
| 5,559,461 | 9/1996 | Yamashina et al. | 327/305 |
| 5,568,062 | 10/1996 | Kaplinsky | 326/27 |
| 5,594,361 | 1/1997 | Campbell | 326/24 |
| 5,604,450 | 2/1997 | Borkar et al. | 326/82 |
| 5,644,255 | 7/1997 | Taylor | 326/81 |
| 5,814,899 | 9/1998 | Okumura | 307/64 |
| 5,852,373 | 12/1998 | Chu et al. | 326/98 |
| 5,892,372 | 4/1999 | Ciraula et al. | 326/96 |
| 5,917,365 * | 6/1999 | Houston | 327/534 |
| 5,986,473 | 11/1999 | Krishnamurthy et al. | 326/83 |
| 5,994,918 | 11/1999 | Mehra | 326/30 |
| 6,002,292 | 12/1999 | Allen et al. | 327/379 |
| 6,044,020 * | 3/2000 | Chung et al. | 365/185.23 |

OTHER PUBLICATIONS

P. Larsson et al., "Noise in Digital Dynamic CMOS Circuits," IEE Journal of Solid–State Circuits, vol. 29, No. 6, Jun. 1994, pp. 655–662.

K. Shepard et al., "Noise in Deep Submicron Digital Design," ICCAD '96, pp. 524–531, 1996.

Z. Wang et al., "Fast Adders Using Enhanced Multiple–Output Domino Logic," IEEE Journal of Solid–State Circuits, vol. 32, No. 2, Feb. 1997, pp. 206–214.

(List continued on next page.)

Primary Examiner—Terry D. Cunningham
Assistant Examiner—Quan Tra
(74) Attorney, Agent, or Firm—Alan K. Aldous

(57) ABSTRACT

In some embodiments, the invention includes a die having a driver circuit. The driver circuit includes a driver input node and a driver output node. An nFET pull-up transistor is connected to the driver output node, and wherein the nFET pull-up transistor is at times forward body biased and the forward body bias is substantially greatest when a signal at the driver input node begins to switch high and substantially least when the switching has already essentially occurred. In some embodiments, the driver includes a first inverter to receive an input signal from the driver input node and provide an inverted input signal at a first inverter output node. The driver includes second inverter to receive the inverted input signal from the first inverter output node and provide a driver output signal at the driver output node. The driver includes an nFET pull-up transistor connected between the driver output node and a power supply node, the nFET pull-up transistor having a gate tied to the driver input node. In some embodiments, the nFET pull-up transistor is at times forward body biased. Other embodiments are described and claimed.

20 Claims, 4 Drawing Sheets

OTHER PUBLICATIONS

PCT Published Application WO 98/59419.

U.S. Patent application, Ser. No. 09/157,089, filed Sep. 18, 1998.

J. Gil et al. "A High Speed and Low Power SOI Inverter using Active Body–Bias," Int'l Symposium on Lower Power Electronics and Design, 1998, pp. 59–63.

F. Assaderaghi et al. "A Dynamic Threshold Voltage MOSFET (DTMOS) for Ultra–Low Voltage Operation, " IEDM 94, pp. 809–812, 1994.

F. Assaderaghi et al. "A Dynamic Threshold Voltage MOSFET (DTMOS) for Very Low Votlage Operation," IEEE Electron Device Letters, vol. 15, No. 12, Dec. 1994, pp. 510–512.

Y. Nakagome et al. "Sub–1–V Swing Internal Bus Architecture for Future Low–Power ULSI's" IEEE Journal of Solid–State Circuits, vol. 28, No. 4, Apr. 1993, pp. 414–419.

T. Sakurai et al. "Low–Power CMOS Design through Vth Control and Low–Swing Circuits" Proceedings of Int'l Symp. On Low Power Electronics and Design, Aug. 18, 1997, pp. 1–6.

H. Zhang et al. "Low–Swing Interconnect Interface Circuits," Proceedings of Int'l Symp. On Low Power Electronics and Design, Aug. 10, 1998, pp. 161–166.

M. Haycock et al., "A 2.5 Gb/s Bidirectional Signaling Technology," Proceedings of IEEE Hot Interconnects Symposium, Aug. 21, 1997, pp. 149–156.

* cited by examiner

DYNAMIC THRESHOLD SOURCE FOLLOWER VOLTAGE DRIVER CIRCUIT

BACKGROUND OF THE INVENTION

1. Technical Field of the Invention

The present invention relates to circuits and more particularly, to a dynamic threshold source follower voltage driver circuit.

2. Background Art

A driver circuit is used to provide the ability to quickly change the input voltage of a receiver circuit that it drives. Instances in which a driving circuit may be used include to drive a relatively long interconnect conductor and to drive a wide fan-out set of conductors. A commonly used driver circuit includes first and second inverters connected in series, wherein each inverter includes a pull-up p-channel metal oxide semiconductor field effect transistor (pMOSFET) in series with a pull down n-channel MOSFET (nMOSFET). The input to the driver is the input to the first inverter. The output of the first inverter is the input to the second inverter and the output of the second inverter is the output of the driver.

Point-to-point on-chip interconnects between and within microprocessor datapath Functional Unit Blocks (FUBs) have evolved with integration as major on-chip performance and power bottlenecks. A reason for this is that interconnect capacitance per unit length, dominated by sidewall fringing and cross-coupling, may increase hyperbolically with lateral dimension scaling and hence scale slower than gate capacitance does, despite technology enhancements such as low-K dielectric materials and copper metallization.

Dynamic threshold (Vt) based circuit techniques have been investigated for low-voltage datapath circuits and interconnect drivers. See, e.g., F. Assaderaghi et al., "A Dynamic Threshold Voltage MOS (DTMOS) for Very Low Voltage Operation," IEEE Electron Device Letters, December 1994, pp. 510–512; and U.S. Pat. No. 5,559,368. These circuits possess "dynamic" Vt transistors, i.e., transistors whose Vt changes as the gate switches. Therefore, as the input transitions, the gate-to-bulk forward bias voltage of the switching transistor increases, causing a Vt reduction (due to body effect) as the gate switches. However, since the bulk terminals are directly tied to the inputs, the fan-in gate capacitance is now substantially higher. This significantly degrades the potential performance benefits and may contribute to higher switched capacitance, and hence higher switching power consumption. Further, since each transistor must have its gate and bulk connected, a separate well is required for each device, resulting in considerable layout area penalties.

SUMMARY OF THE INVENTION

In some embodiments, the invention includes a die having a driver circuit. The driver circuit includes a driver input node and a driver output node. An nFET pull-up transistor is connected to the driver output node, and wherein the nFET pull-up transistor is at times forward body biased and the forward body bias is substantially greatest when a signal at the driver input node begins to switch high and substantially least when the switching has already essentially occurred.

In some embodiments, the driver includes a first inverter to receive an input signal from the driver input node and provide an inverted input signal at a first inverter output node. The driver includes second inverter to receive the inverted input signal from the first inverter output node and provide a driver output signal at the driver output node. The driver includes an nFET pull-up transistor connected between the driver output node and a power supply node, the nFET pull-up transistor having a gate tied to the driver input node.

In some embodiments, the nFET pull-up transistor is at times forward body biased.

Other embodiments are described and claimed.

BRIEF DESCRIPTION OF THE DRAWINGS

The invention will be understood more fully from the detailed description given below and from the accompanying drawings of embodiments of the invention which, however, should not be taken to limit the invention to the specific embodiments described, but are for explanation and understanding only.

DETAILED DESCRIPTION

In some embodiments, the invention involves a driver circuit having a double inverter buffer bypassed with a pull-up n-channel field effect transistor (nFET) operating in a source follower mode. In the source follower mode, the nFET pull-up transistor may stay in the high saturation region throughout the switching period. This is in contrast to a pFET pull-up transistor that is in the saturation region for a relatively small percentage of a switching period. An advantage of this driver circuit is that as the driver input signal transitions from low to high, the source follower nFET pull-up transistor begins to pull up the driver output signal before the second inverter of the double inverter does, increasing the switching speed. Once the second inverter switches, it finishes pulling the driver output signal high.

In some embodiments, the nFET pull-up transistor is forward body biased to decrease the threshold voltage (Vt). Decreasing Vt not only increases the switching speed but also increases the range of effectiveness of the nFET pull-up transistor. That is, the nFET pull-up transistor will pull up the driver output signal to Vdd−Vt. If Vt is smaller, the range of effectiveness is greater. A forward body biased nFET pull-up transistor has the quality that the forward body bias is greatest or near greatest when the driver input begins to switch high and least or near least (which could include a zero body bias) when switching has already essentially occurred. Further, the noise rejection may increase with forward body biasing the nFET pull-up transistor.

Figure 1:
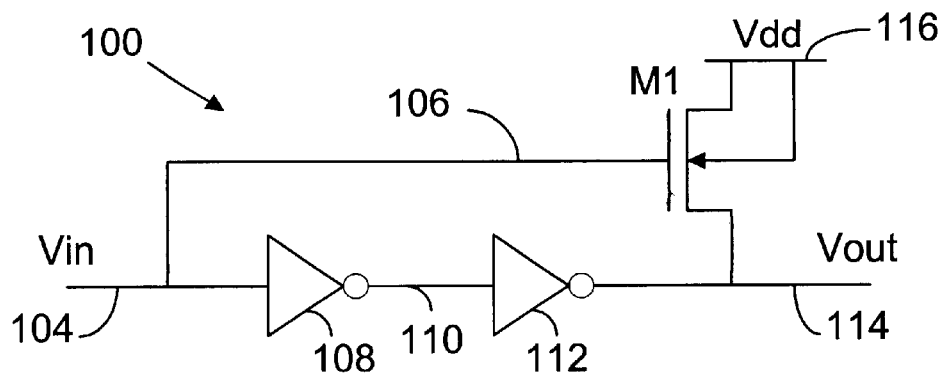
FIG. 1 is a schematic block diagram representation of a driver circuit according to some embodiments of the invention.

As an example, referring to FIG. 1, driver circuit 100 includes a driver input node 104 from which a driver input signal (Vin) is received by a first inverter 108. Vin is also carried on conductor 106 to the gate of an nFET pull-up transistor M1. Inverter 108 inverts the driver input signal to produce an inverted driver input signal at a first inverter output node 110. A second inverter 110 inverts the inverted driver input signal to provide a driver output signal Vout at driver output node 114. The voltage of Vout is influenced by both inverter 112 and nFET M1. When Vin changes from high to low, transistor M1 turns off so that it no longer pulls up Vout. The output signal of inverter 108 is high on node 110 causing inverter 112 to pull down Vout.

An enhancement mode FET turns on when the gate to source voltage Vgs is greater than the threshold voltage Vt. For transistor M1, the gate voltage is Vin and the source voltage is Vout. When Vin changes from low to high, Vgs is greater than Vt and transistor M1 turns on pulling up Vout. However, as the voltage of Vout reaches Vin−Vt, M1 turns off. Note that transistor M1 has a low Vt at the beginning of switching and the Vt progressively increases as the driver transitions beyond the trip point (typically Vdd/2). This is desirable because a lower Vt is more beneficial for speed before reaching the trip point. Assuming a high Vin is at the power supply voltage node Vdd (sometimes also called Vcc), M1 can pull up Vout to only Vdd Vt. However, after a delay through inverter 108, inverter 112 begins to assist in pulling up Vout and can pull Vout to Vdd.

As supply voltage scales down, zero body bias threshold voltages Vt have not scaled as fast. Accordingly, in some embodiments, the switching speed of driver 100 can be increased in two ways by lowering the threshold voltage Vt of transistor M1. First, by lowering Vt, transistor M1 itself will switch faster. Second, M1 will be able to pull up Vout higher, because Vdd−Vt will be greater, allowing a smaller, faster pFET in inverter 112.

One way in which to reduce Vt is to forward body bias M1. An nFET transistor is zero body biased when the voltage of its body Vbody is equal to the voltage of the source Vsource. The nFET transistor is forward body biased when Vbody>Vsource and reverse body biased when Vbody<Vsource. A pFET transistor is zero body biased when Vbody=Vsource, forward body biased when Vbody<Vsource, and reverse body biased when Vbody>Vsource.

One way to forward body bias transistor M1 is to tie the body terminal to power supply voltage node 116 (which is at Vdd) as illustrated in FIG. 1. While this may create latch up when Vdd is more than one volt, it has been found to be effective when Vdd is less than one volt (e.g., 0.9 volts or 0.6 volts). An advantage of the forward body bias technique illustrated in FIG. 1 is the simplicity. Other ways in which to forward body bias or otherwise decrease Vt are described below. While it is true that the leakage of a transistor M1 increases, when it is forward biased, the overall leakage of driver 100 may be reduced because the reduction of Vt may allow a reduction of Vdd. That is, in some situations, if Vt is not reduced, a reduction in Vdd might not be acceptable.

Figure 2:
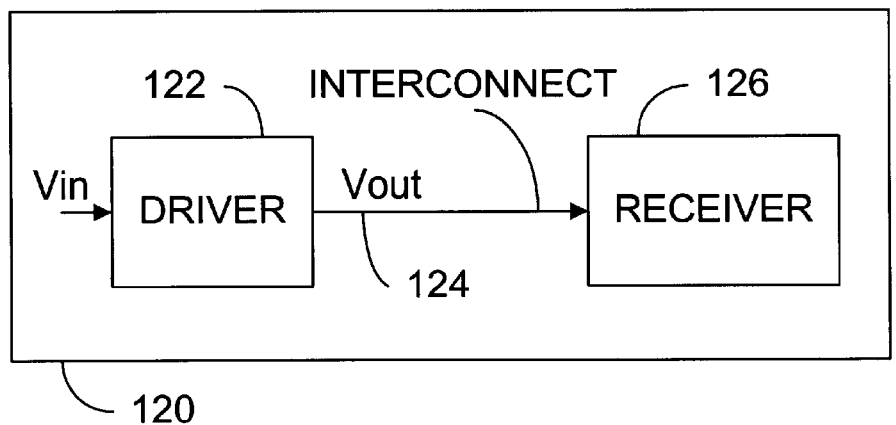
FIG. 2 is a schematic block diagram representation of a die including a driver circuit according to some embodiments of the invention, an interconnect, and a receiver circuit.

Drivers according to the present invention may be used in a variety of contexts. For example, FIG. 2 illustrates a die 120 including a driver 122 which receives an input signal Vin and produces an output signal Vout on an interconnect conductor 124 which is received by a receiver circuit 126. Driver 122 represents any of the various drivers according to the invention described herein. The interconnect may be connected to a port at an edge of die 120. Of course, die 120 would include numerous other components.

Figure 3:
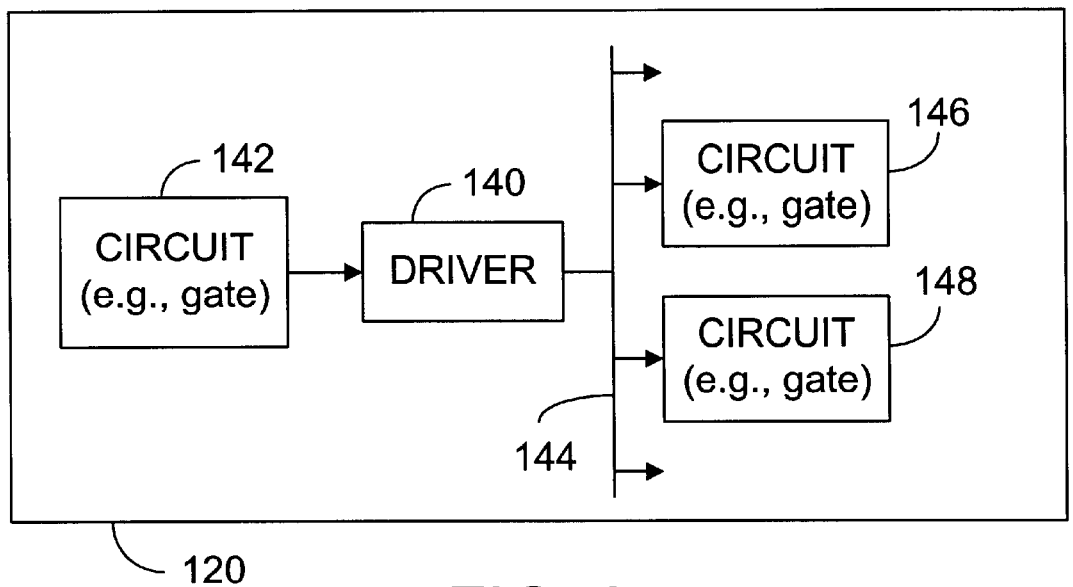
FIG. 3 is a schematic block diagram representation of a die including a driver circuit according to some embodiments of the invention to provide an output signal from a circuit to a wide fan-out set of conductors.

FIG. 3 illustrates a driver 140 that drives an output from a circuit 142 to a wide fan-out on multiple conductors 144. Circuit 142 may be a gate that does not have the driving power to a multiple-conductor fan-out of conductors (e.g., a wide fan-out). Circuits 146 and 148 are examples of circuits being driven by the fan-out. Driver 140 may be any of the various driver circuits according to the invention described herein.

Figure 4:
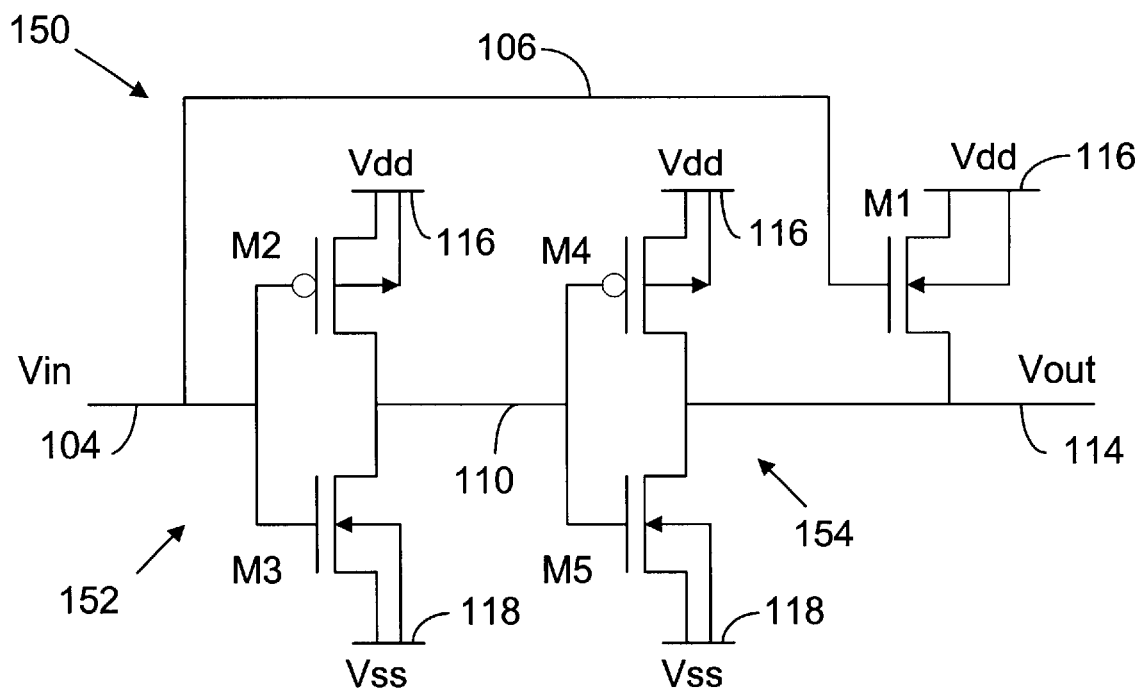
FIG. 4 is a schematic block diagram representation of a driver circuit according to some embodiments of the invention.

FIG. 4 illustrates a driver 150, which is an example of driver circuit 100. In circuit 150, inverters 152 and 154 are examples of inverters 108 and 112 of driver circuit 100. Inverter 152 includes pFET transistor M2 and nFET transistor M3 and inverter 154 includes pFET transistor M4 and nFET transistor M5. In circuit 150, transistors M2–M5 are zero biased.

Figure 5:
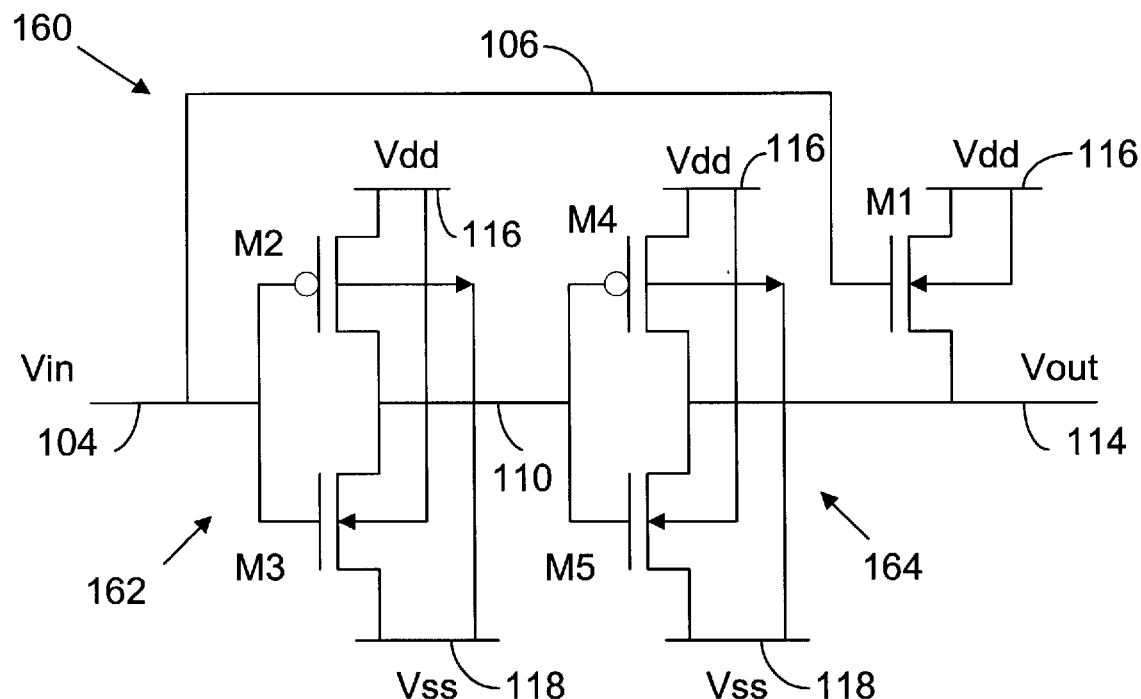
FIG. 5 is a schematic block diagram representation of a driver circuit according to some embodiments of the invention.

FIG. 5 illustrates a driver 160, which is an example of driver circuit 100. In circuit 160, inverters 162 and 164 are examples of inverters 108 and 112 of driver circuit 100. Inverter 162 includes pFET transistor M2 and nFET transistor M3 and inverter 164 includes pFET transistor M4 and nFET transistor MS. In circuit 160, transistors M2–M5 are forward body biased by tying the body of pFET transistors M2 and M4 to ground voltage node 118 and tying the body of nFET transistors M3 and M5 to the power supply voltage node 116. Although driver 160 has more leakage than does driver 150, it may have a higher switching speed.

Figure 6:
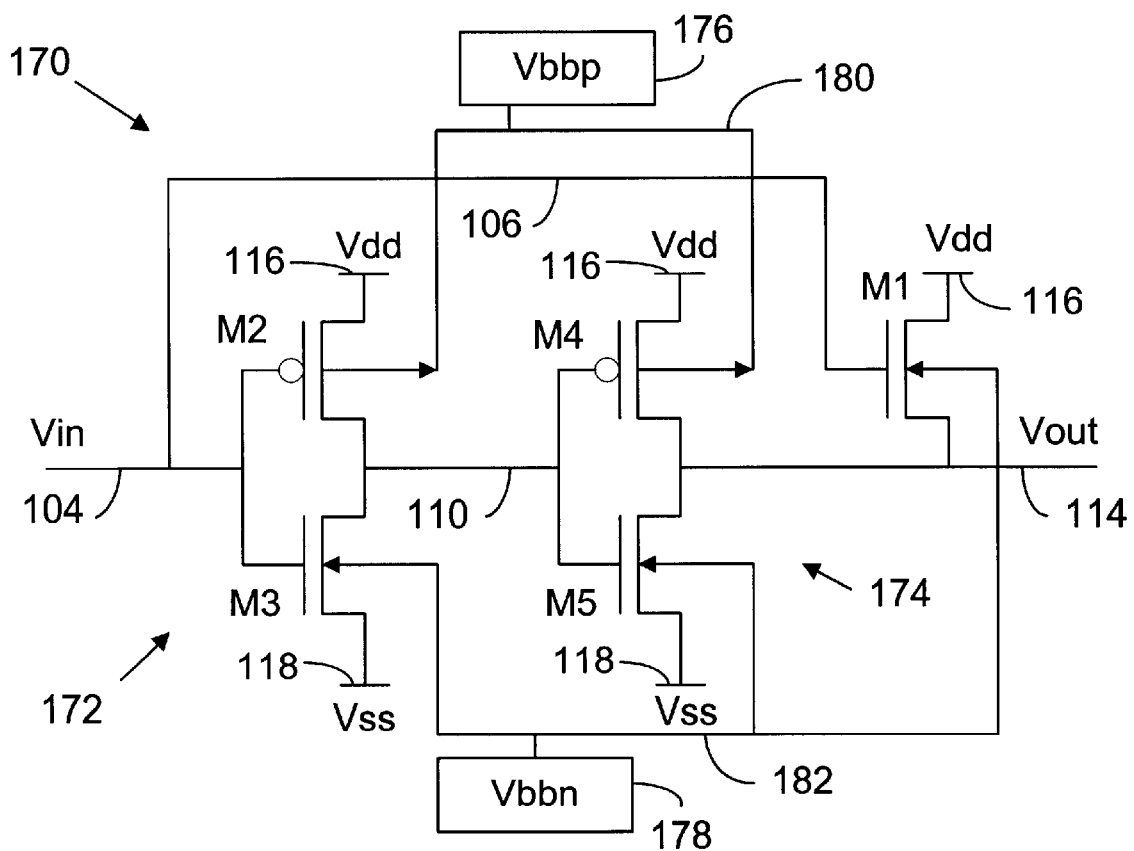
FIG. 6 is a schematic block diagram representation of a driver circuit according to some embodiments of the invention.

FIG. 6 illustrates a driver 170, which is an example of driver circuit 100. In circuit 170, inverters 172 and 174 are examples of inverters 108 and 112 of driver circuit 100. Inverter 172 includes pFET transistor M2 and nFET transistor M3 and inverter 174 includes pFET transistor M4 and nFET transistor M5. A body bias voltage circuit 176 provides a voltage Vbbp at a body bias node 180 to bias the body of pFET transistors M2 and M4. Voltage Vbbp may be constant or vary depending on whether the driver circuit is in a high performance mode or low power mode or perhaps a third mode between them. When Vbbp is less than Vsource of the pFET transistors (at Vdd), they are forward biased. A body bias voltage circuit 178 provides a voltage Vbbn at a body bias node 182 to bias the body of pFET transistors M1, M3, and M5. Voltage Vbbn may be constant or vary depending on whether the driver circuit is in a high performance mode or low power mode or perhaps a third mode between them. When Vbbn is greater than Vsource of the nFET transistors (at Vss), they are forward biased. It is not necessary that each transistor be biased in the same way, although it is convenient for all transistors sharing a body to have the same bias. For example, some transistors could be zero body biased, while another(s) is forward body biased. Some could also have a particular body bias (while the driver circuit is operational), e.g., through being tied to a supply or ground node, while another transistor(s) has a variable body bias. As used herein the term body includes material of a substrate or a well.

The embodiments of the present invention described herein have advantages when compared to a double inverter driver constructed according to the prior art dynamic threshold voltage MOSFET (DTMOS) technique, wherein the body of the transistors is tied to the respective gate. For example, drivers 100, 150, 160, and 170 have the source follower nFET transistor M1 has a full Vdd to Vss of body to source forward bias voltage only at the beginning of switching. Therefore, the interconnect driver has a low Vt at the beginning of switching and the Vt progressively increases as the driver transitions beyond the trip point (typically Vdd/2). This is in contrast to DTMOS, which has a high Vt at the beginning of switching and the Vt reduces progressively as the driver transitions beyond the trip point. Since a lower Vt is more beneficial for speed before reaching the trip point, the invention enjoys a significantly improved delay advantage over DTMOS. There may also be lower leakage power consumption.

Another advantage is that the gate capacitance of circuits 100, 150, 160, and 170 is less than that of an double inverter driver using the prior art DTMOS technique. With the DTMOS technique, the gate capacitance is increased because the gate is connected to the body, particularly causing a problem with wide fan-in arrangements.

Still another advantage is that in driver circuits 150, 160, and 170, the pFET transistors can share a body and the nFET transistors can share a body, whereas with the prior art DTMOS technique each transistor has its own body. The layout density can be significantly better than DTMOS and comparable to conventional CMOS circuits. This allows usage of the invention on datapath interconnect drivers and repeaters, which are typically area-critical, without sacrificing layout density. (Of course, it is not required that each nFET transistor in the driver according to the present invention share a body and not required that each pFET transistor in a driver according to the present invention share a body.)

The performance advantage can also be leveraged for further leakage power reduction by downsizing the driver transistors—this linearly reduces leakage currents. Since dynamic power of the predriver may depend on the driver gate capacitance, the downsizing of driver devices also offers a linear predriver dynamic power reduction.

Since the source follower nFET transistor M1 begins the pull-up transition with a low Vt, this improves the range of effectiveness of the source follower. This is because, a source follower pull-up device is effective until Vdd–Vt, beyond which it is turned off. Thus, any lowering of Vt during pull-up transition is of vital importance, offering significant delay reduction over a non-biased source follower transistor (i.e., body terminal tied to Vss).

Figure 7:
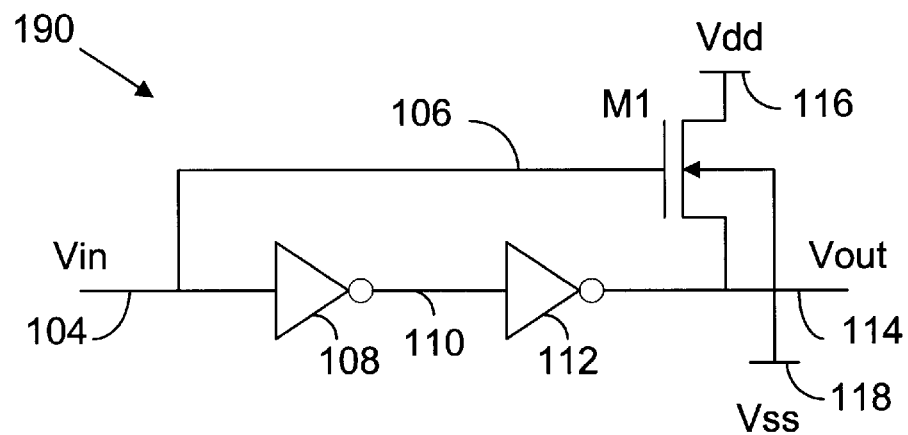
FIG. 7 is a schematic block diagram representation of a driver circuit according to some embodiments of the invention.

FIG. 7 illustrates a driver 190, which is similar to driver 100 except that the body of transistor M1 is tied to ground node 118 rather than to supply node 116 so that it is zero biased rather than forward biased.

Figure 8:
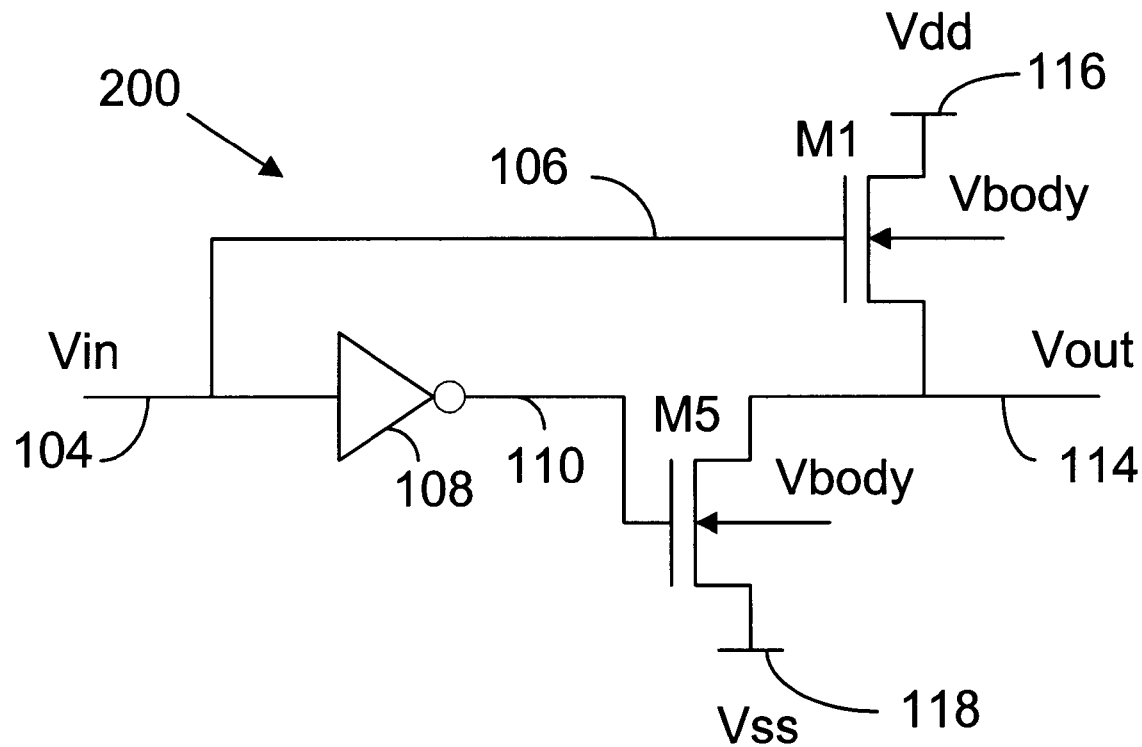
FIG. 8 is a schematic block diagram representation of a driver circuit according to some embodiments of the invention.

FIG. 8 illustrates a driver 200, which is similar to driver 100 except that inverter 112 is replaced with a single nFET transistor M5. Accordingly, Vout does not have a full voltage swing, but rather swings from Vss to Vdd–Vt. Vbody of M1 could be forward, zero, or reverse biased. Vbody of M5 could be forward, zero, or reverse biased.

The forward body bias of transistor M1 allows it to provide higher resistance and better noise rejection with respect to the power supply at node 116. Noise may also be reduced by placing a pFET transistor between output node 114 and ground node 118, with its gate tied to input node 104.

The invention may be used in connection with bi-directional switching.

Transistors M1–M5 may be MOSFETs or other type of FETs. Note that transistors M1–M5 could have different parameter values (e.g., size, threshold voltage at zero bias, etc.) in different circuits. For example, transistor M1 might have different parameter values in FIG. 4 than in FIG. 5. Different ones of transistors M1–M5 could be have different parameter values. For example, M1 could have different parameter values than M3, which could have different parameter values than M5. Enhancement or depletion mode transistors may be used.

The shapes and sizes of components of the drawings are not intended to suggest actual shapes or relative sizes.

In some embodiments of the invention, some of the transistors could include a DTMOS arrangement.

The supply and ground nodes do not have to be Vdd and Vss and are not necessarily the same as other supply and ground nodes in the die.

Figure 9:
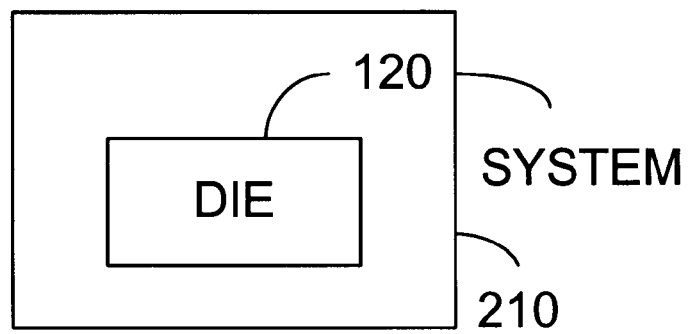
FIG. 9 is a schematic block diagram representation of a system including a die having a driver according to the present invention.

A die containing a driver according to the present invention could be for any of a various types of electrical devices including a microprocessor, DSP (digital signal processor), embedded controller, ASIC (application specific integrated circuit), in connection with register files, chipset, networking, communications including (RF) radio frequency, etc. Referring to FIG. 9, a die 120 is part of a system 210, which may be a personal computer, mainframe computer, computer with a DSP, microcomputer, hand held computer, communication system, or a variety of other systems.

Reference in the specification to "some embodiments" or "other embodiments" means that a particular feature, structure, or characteristic described in connection with the embodiments is included in at least some embodiments, but not necessarily all embodiments, of the invention. The various appearances of the term "some embodiments" in the description are not necessarily all referring to the same embodiments.

The term "responsive" and related terms mean that one signal or event is influenced to some extent by another signal or event, but not necessarily completely or directly. If the specification states a component, event, or characteristic "may", "might" or "could" be included, that particular component, event, or characteristic is not required to be included.

Those skilled in the art having the benefit of this disclosure will appreciate that many other variations from the foregoing description and drawings may be made within the scope of the present invention. Accordingly, it is the following claims including any amendments thereto that define the scope of the invention.

What is claimed is:

1. A die comprising:
    a driver circuit including:
        a power supply node;
        a driver input node;
        a driver output node; and
        an nFET pull-up transistor connected to the driver output node, and wherein the nFET pull-up transistor is at times forward body biased and the body bias is substantially greatest when a signal at the driver input node begins to switch high and substantially least when the switching has already essentially occurred, wherein the nFET pull-up transistor has a body tied directly to the power supply node.

2. The die of claim 1, wherein the nFET pull-up transistor has a threshold voltage that is substantially lowest when the signal at the driver input node begins to switch high and increases as the driver input increases beyond a trip point.

3. The die of claim 1, wherein a body bias voltage applied to a body of the nFET pull-up transistor changes depending on a mode the driver is in.

4. The die of claim 1, wherein a body of the nFET pull-up transistor shares a body with other transistors in the die.

5. The die of claim 1, wherein transistors of the driver including the nFET pull-up transistor have bodies that are not connected to their gates.

6. The die of claim 1, wherein the driver is used in connection with bi-directional switching.

7. The die of claim 1, wherein the nFET pull-up transistor has a gate connected to the driver input node.

8. The die of claim 1, wherein the nFET pull-up transistor has a body tied to a body bias voltage node.

9. The die of claim 1, wherein the die is included in a computer system.

10. A die comprising:
a driver circuit including:
a driver input node;
a driver output node;
a first inverter to receive an input signal from the driver input node and provide an inverted input signal at a first inverter output node;
a second inverter to receive the inverted input signal from the first inverter output node and provide a driver output signal at the driver output node; and
an nFET pull-up transistor connected between the driver output node and a power supply node, the nFET pull-up transistor having a gate tied to the driver input node, and wherein the nFET pull-up transistor is tied to a body bias voltage node, and wherein the first inverter has a pFET pull-up transistor and an nFET pull-down transistor and the pFET and nFET transistor of the first inverter are either both forward body biased or both not forward body biased and wherein the second inverter has a pFET pull-up transistor and an nFET pull-down transistor and wherein the pFET pull-up transistors of the first and second inverters have a body tied to a first body bias voltage node and the nFET pull-down transistors of the first and second inverters have a body tied to the body bias voltage node to which the body of the nFET pull-up transistor is tied.

11. The die of claim 10, wherein the nFET pull-up transistor pulls up the driver output signal up to a first voltage equal to the power supply node voltage minus a threshold voltage of the nFET pull-up transistor and the second inverter pulls the driver output signal from approximately the first voltage to the power supply node voltage.

12. The die of claim 10, further comprising:
a receiver circuit; and
an interconnect coupled between the driver output node and the receiver circuit.

13. The die of claim 10, further comprising:
a logic circuit to provide the input signal to the driver input node; and
a multi-conductor fan out connected to the driver output node.

14. The die of claim 10, wherein the die is included in a computer system.

15. The die of claim 10, the second body bias voltage node is the same as the body bias voltage node to which the nFET pull-up transistor is tied.

16. A die comprising:
a driver circuit including:
a driver input node;
a driver output node;
a first inverter to receive an input signal from the driver input node and provide an inverted input signal at a first inverter output node;
a second inverter to receive the inverted input signal from the first inverter output node and provide a driver output signal at the driver output node; and
an nFET pull-up transistor connected between the driver output node and a power supply node, the nFET pull-up transistor having a gate tied to the driver input node and a body tied directly to a power supply node.

17. A die comprising:
a driver circuit including:
a driver input node;
a driver output node;
a first inverter to receive an input signal from the driver input node and provide an inverted input signal on a first inverter output node;
an nFET pull-up transistor coupled between the driver output node and a power supply node, the nFET pull-up transistor having a gate tied to the driver input node and a body directly tied to the power supply node; and
an nFET pull-down transistor coupled between the driver output node and a ground node, the nFET pull-down transistor having a gate tied to the first inverter output node.

18. The die of claim 12, wherein the first inverter includes a pFET pull-up transistor and an nFET pull-down transistor, and a body of the pFET pull-up transistor is tied to the ground node, and the body of the nFET transistor is tied to the power supply node.

19. The die of claim 17, wherein the nFET pull-down transistor has a body tied to the power supply node.

20. A die comprising:
a driver circuit including:
a driver input node;
a driver output node;
a first inverter to receive an input signal from the driver input node and provide an inverted input signal at a first inverter output node;
a second inverter to receive the inverted input signal from the first inverter output node and provide a driver output signal at the driver output node; and
an nFET pull-up transistor connected between the driver output node and a power supply node, the nFET pull-up transistor having a gate tied to the driver input node, and wherein a body of the nFET pull-up transistor is tied to the power supply node, and wherein the first inverter has a pFET pull-up transistor and an nFET pull-down transistor and the pFET and nFET transistor of the first inverter are either both forward body biased or both not forward body biased, and
wherein the second inverter has a pFET pull-up transistor and an nFET pull-down transistor and the pFET pull-up transistors of the first and second inverters have a body tied to a ground node and the nFET pull-down transistors of the first and second inverters have a body tied to the power supply node.

* * * * *

UNITED STATES PATENT AND TRADEMARK OFFICE
CERTIFICATE OF CORRECTION

PATENT NO. : 6,271,713 B1
DATED : August 7, 2001
INVENTOR(S) : Krishnamurthy

It is certified that error appears in the above-identified patent and that said Letters Patent is hereby corrected as shown below:

Column 4,
Line 32, delete "MS", insert -- M5 --.

Signed and Sealed this

Fourth Day of June, 2002

Attest:

Attesting Officer

JAMES E. ROGAN
*Director of the United States Patent and Trademark Office*